US012248010B2

United States Patent
Jang et al.

(10) Patent No.: US 12,248,010 B2
(45) Date of Patent: Mar. 11, 2025

(54) ELECTROMAGNETIC WAVE LEAKAGE MEASUREMENT SYSTEM

(71) Applicant: KOREA TESTING LABORATORY, Jinju-si (KR)

(72) Inventors: Hong Je Jang, Jinju-si (KR); Tae-seung Song, Jinju-si (KR); Han Hee Lee, Jinju-si (KR)

(73) Assignee: KOREA TESTING LABORATORY, Jinju-si (KR)

( * ) Notice: Subject to any disclaimer, the term of this patent is extended or adjusted under 35 U.S.C. 154(b) by 112 days.

(21) Appl. No.: 18/307,681

(22) Filed: Apr. 26, 2023

(65) Prior Publication Data

US 2024/0319245 A1 Sep. 26, 2024

(30) Foreign Application Priority Data

Mar. 20, 2023 (KR) .................. 10-2023-0035855

(51) Int. Cl.
*G01R 29/08* (2006.01)
*G01R 31/00* (2006.01)

(52) U.S. Cl.
CPC ..... *G01R 29/0835* (2013.01); *G01R 29/0878* (2013.01); *G01R 29/0892* (2013.01); *G01R 31/001* (2013.01)

(58) Field of Classification Search
CPC ....................................................... G01R 27/28
See application file for complete search history.

(56) References Cited

U.S. PATENT DOCUMENTS

| 2009/0041380 A1* | 2/2009 | Watanabe | G09G 3/2092 382/276 |
| 2011/0227559 A1* | 9/2011 | Miyazaki | G01R 29/0885 324/96 |

* cited by examiner

*Primary Examiner* — Tung X Nguyen
(74) *Attorney, Agent, or Firm* — Boisbrun Hofman, PLLC

(57) ABSTRACT

The electronic wave leakage measurement system according to the present invention is a system for measuring the electronic wave leakage of an electronic wave shielding structure. The system comprising a signal generator for generating an electronic wave generation signal; a transmitting antenna for transmitting the electronic wave towards a wall surface of the electronic wave shielding structure by receiving the signal from the signal generator; a receiving antenna capable of beam steering and comprising N individual antenna modules for receiving the electronic wave that has passed through the wall surface of the electronic wave shielding structure; and a signal analyzer that analyzes and displays the received electronic wave signal from the receiving antenna.

10 Claims, 1 Drawing Sheet

ELECTROMAGNETIC WAVE LEAKAGE MEASUREMENT SYSTEM

CROSS-REFERENCE TO RELATED APPLICATIONS

This invention claims the benefit of Korean Patent Application No. KR 10-2023-0035855, entitled "ELECTROMAGNETIC WAVE LEAKAGE MEASUREMENT SYSTEM," filed on Mar. 20, 2023, the entire disclosure of which is hereby incorporated herein by reference.

FIELD AND BACKGROUND OF THE DISCLOSURE

This invention relates to an electromagnetic wave leakage measurement system, and more specifically, a system for measuring electromagnetic waves leaking from an electromagnetic wave shielding structure or from an electromagnetic wave shielding room.

Electromagnetic wave shielding structure or room are being constructed or manufactured as electromagnetic wave shielding materials are used for the purpose of blocking electromagnetic waves from external or internal sources for specific purpose.

Meanwhile, due to reasons such as poor performance of electromagnetic shielding materials or degradation of their performance over time, it is necessary to measure whether electromagnetic waves cannot penetrate into the interior of electromagnetic shielding structure or room from the outside, or whether internal electromagnetic waves leakage.

In the past, there was no dedicated system known for measuring electromagnetic wave leakage for such purposes, and a commonly used method was to detect it by manually moving a transmitting antenna and a receiving antenna.

Nonetheless, manually adjusting antennas can be labor-intensive and less precise, and it may be infeasible to detect leakage in instances involving large or high-rise structures. As a result, dedicated electromagnetic wave leakage measurement systems are essential for these applications.

SUMMARY OF THE DISCLOSURE

One aspect of this invention offers a system that employs an electronic beam scanning technique to pinpoint and assess the locations where electromagnetic waves escape from a shielding structure or room designed to block such emissions.

The present invention provides an electromagnetic wave leakage measurement system, specifically designed to quantify the level of electromagnetic wave leakage originating from within an electromagnetic shielding structure.

The electromagnetic wave leakage measurement system consists of a signal generator that produces an electromagnetic wave generation signal, a transmitting antenna that receives the signal from the generator and emits the electromagnetic wave toward one side of the shielding structure's wall, a receiving antenna that captures the electromagnetic wave after it has penetrated the shielding structure's wall and includes N individual antenna modules for beam steering, and a signal analyzer that examines and displays the electronic wave signals captured by the receiving antenna.

The receiving antenna can be a phased array antenna with N individual antenna modules (E1, E2, . . . , En), and each individual antenna modules can control the direction of the electromagnetic wave by applying a different phase to each module.

Furthermore, the N individual antenna modules can receive the electromagnetic waves leaked from the wall partitioned areas (M1, M2, . . . , Mn) assigned on the wall. In this case, it is desirable for each individual antenna modules to comprise a phase shifter that can apply a different phase to control the direction of the received electromagnetic wave.

In this case, the aforementioned individual antenna modules on the other side may comprise an up-converter that uses binary switches to apply different phases to each other.

The signal analyzer measures the electromagnetic waves received by the individual antenna modules and analyzes whether there is any leakage of the waves in the wall partitioned areas. The results of the analysis can be displayed on the display screen in the form of the wall partitioned areas and can be mapped in a 1:1:1 ratio with the individual antenna modules and the display screen partitioned areas (D1, D2, . . . , Dn).

Another aspect of the present invention comprising a method for measuring electromagnetic leakage of an electromagnetic shielding structure, comprising a first matching step, a receiving step, and an analysis step.

The first matching step is a process of matching individual antenna modules of the receiving antenna with the wall partition area of the wall where the measurement of electromagnetic wave leakage is to be conducted.

The transmission step is a process where an electromagnetic wave is transmitted towards the wall using a transmission antenna on one side of the wall.

The receiving step is the process of the individual antenna modules assigned to the wall partition area receiving the electromagnetic waves leaking from the wall partition area.

The analysis step is a process of analyzing the received electromagnetic waves from the receiving step to determine the location of the electromagnetic wave leakage, and displaying the leakage location on the display screen.

The electronic wave leakage measurement system according to one aspect of the present invention can detect and measure the points where electronic waves leak in an electromagnetic shielding structure or an electromagnetic shielding room using electronic beam steering.

This provides fast frequency scanning speed and high efficiency by matching phase array antennas with electromagnetic shielding structure or shielding room without moving the receiver by hand. In addition, the phase array antenna provides high precision and flexibility by quickly changing the beam direction compared to a passive antenna array.

DETAILED DESCRIPTION

Prior to describing the present disclosure in detail hereinbelow, it should be understood that the terms used in the present specification are solely for the purpose of describing specific embodiments, and not to limit the scope of the present disclosure that is limited only by the scope of the claims attached hereto. All technical terms and science terms used in the present specification have the same meaning as should be generally understood by a person with ordinary skill in the related art unless it is mentioned otherwise.

In addition, in describing the components of the present invention, terms such as "first," "second." "A," "B." "(a)," "(b)," and the like may be used. Such terms are used merely to distinguish one component from another and do not limit the essence, order, or sequence of the component in any way. When a component is described as being "connected." "coupled." or "interfaced" to another component, it should be understood that the component may be directly connected or interfaced to the other component, or there may be another component between the two components that is "connected." "coupled," or "interfaced" to both components.

Furthermore, when a component such as a layer, film, area, or plate is described as being "on" or "above" another component, this includes cases where there is another component in between. Conversely, when a component is described as being "directly above" or "on top of" another part, it means that there is no other part in between. Moreover, when a component is described as being "above" or "on top of" a reference part, it means that the component is located above or on top of the reference part, and it does not necessarily mean that it is located in the direction opposite to gravity.

In addition, in describing the present invention, when referring to a part that "comprise" a certain component, it means that the part may comprise other components unless specifically stated otherwise, rather than excluding other components. Furthermore, when referring to "on a plane," it means the view from the top, and when referring to a "cross-section," it means the view from the side after cutting the object vertically.

Figure 1:
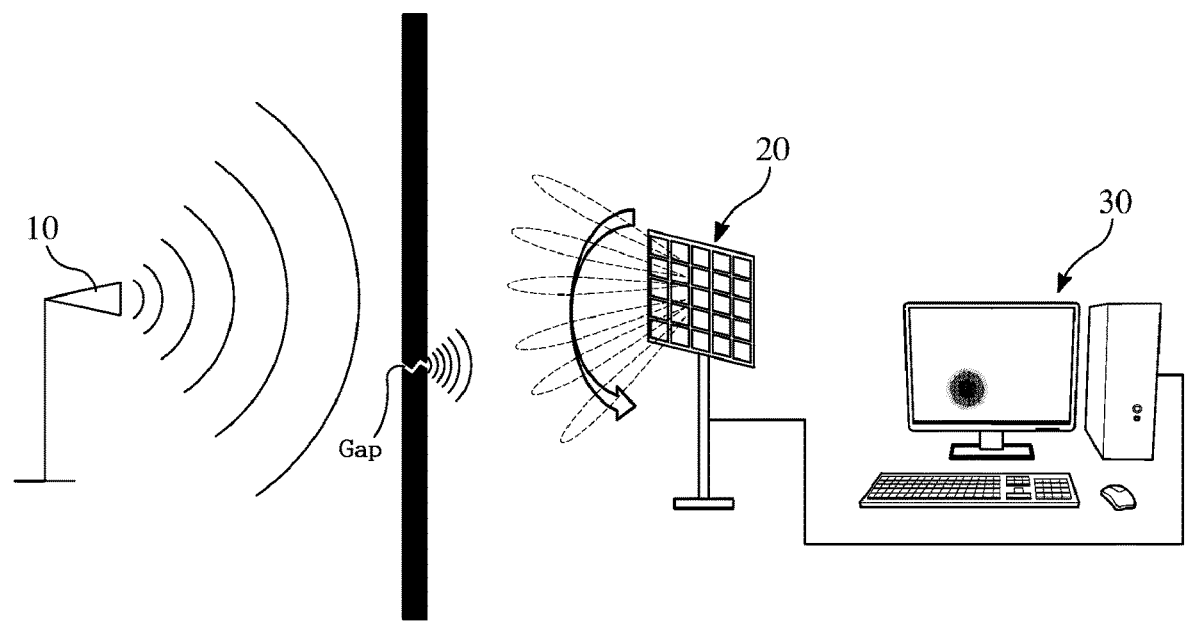
FIG. 1 is a schematic view of at least a portion of an electromagnetic wave leakage measurement system according to one or more aspects of the present disclosure.

In the following description, an embodiment of an electromagnetic wave leakage measurement system according to the present invention will be described with reference to the figures. FIG. 1 is a schematic view of an electromagnetic wave leakage measurement system according to one or more aspects of the present disclosure. Accordingly, the electromagnetic wave leakage measurement system according to the present invention comprises a signal generator (not shown), a transmitting antenna (10), a receiving antenna (20), and a signal analyzer (30).

The signal generator (10) generates a frequency signal and generates an electromagnetic wave with a specific frequency range (f) through the transmitting antenna (20).

The transmitting antenna emits the electromagnetic wave towards a wall (B) or an electromagnetic shielding structure, from one side of an electromagnetic shielding room.

The receiving antenna (20) receives the leaked electromagnetic waves that can pass through gaps in the electromagnetic shielding structure or electromagnetic shielding room, which are not blocked by the electromagnetic waves generated by the transmitting antenna (10). The receiving antenna (20) can comprise a phase array antenna that is capable of beam steering. The phase array antenna is a configuration of antennas for beam steering in the present invention, where various individual antenna modules are arranged and the beam direction is controlled by applying different phases to each module.

Each individual antenna modules (E1, E2, ... , En) performs beam steering using an electrical phase adjustment method to generate electromagnetic waves in the allocated wall partition areas (M1, M2, ... , Mn) of the structure to be verified for electromagnetic leakage, such as a wall surface (B), and receives reflected waves from the allocated area to receive the leaked electromagnetic wave signals in the allocated area. The method of assigning different phases to each individual antenna modules are not limited, but it is preferable to perform beam steering by adjusting the relative phase of the antenna modules by inserting a phase delay device into each antenna module.

Alternatively, an up-converter using binary switches can be used. By controlling each binary switch electrically, the input signal can pass through to the output signal when the switch is closed, and the input signal is blocked when the switch is open. By adjusting multiple switches, the phase of the output signal can be controlled, and this method has the advantage of a simple circuit and the ability to reduce the size of the antenna array.

The signal analyzer (30) measures the electromagnetic waves received from the assigned wall partitioned areas in each antenna module to analyze whether electromagnetic wave leakage occurs in the corresponding partitioned areas and displays the results in the screen. At this point, the displayed screen comprises graphics showing the area of the electromagnetic wave blocking wall, as well as the screen partitioned areas corresponding one-to-one with the individual antenna modules.

Figure 2:
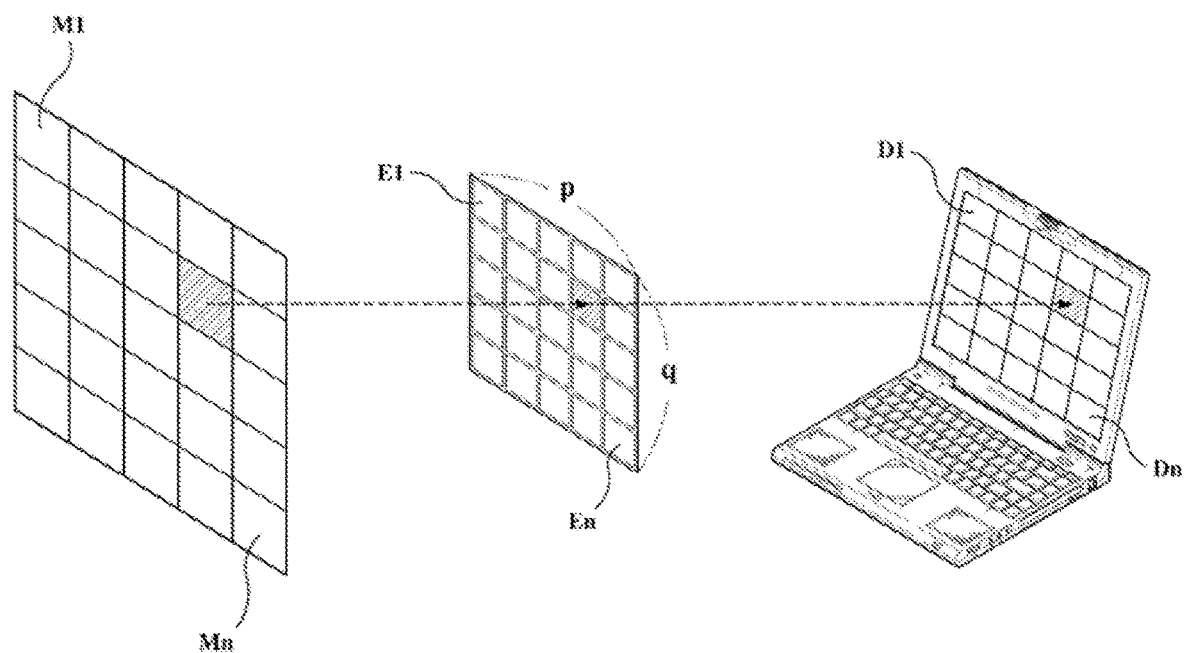
FIG. 2 is a schematic view showing the mapping between the wall partitioned areas, individual antenna modules, and display partitioned areas according to one or more aspects of the present disclosure.

FIG. 2 is a schematic view showing the mapping between the wall partitioned areas, individual antenna modules, and display partitioned areas according to one or more aspects of the present disclosure. According to this, the individual antenna modules (E1, E2, ... , En), the assigned wall partitioned area (M1, M2, ... , Mn) of the structure to be tested for electromagnetic wave leakage, and the screen partitioned areas (D1, D2, ... , Dn) on the display are mapped one-to-one in a 1:1:1 ratio, making it easy to find the leakage point.

Meanwhile, the individual antenna modules of the receiving antenna (20) can be arranged in p rows×q columns, with the sum of the length and height of each module constituting the total length and height. The receiving antenna is equipped with p×q individual antenna modules (E1, E2, ... , En), totaling N modules.

The number of individual antenna modules in operation may vary depending on the shape and distance of the wall surface from which the electromagnetic waves are leaking. For example, the area of the wall surface covered by the individual antenna modules may change depending on the distance between the wall surface and the receiving antenna. In other words, when the distance is closer, fewer individual antenna modules may be in operation. Additionally, if the wall surface has a rectangular shape, the individual antenna modules of the receiving antenna can also be made rectangular by not activating certain rows or columns of individual antenna modules, allowing a 1:1 matching between the areas of the receiving antenna's individual modules and the wall surface (B).

Therefore, even if the ratio of the length and height of the individual antenna modules do not match the ratio of the length and height of the wall, making it difficult to achieve a 1:1 match, it is possible to adjust the operating area of the individual antenna modules to enable a 1:1 match.

In other words, when the shape ratio of the wall's length and height does not match the shape ratio of the antenna module's length and height, making a 1:1 match difficult, the solution is to adjust some of the individual antenna modules to operate only in specific areas. This allows for a 1:1 match between the individual receiving antenna modules and the wall area, aligning the shape of the wall with the operational area of the antenna modules.

The following describes the method for measuring electromagnetic leakage according to the present invention. The method for measuring electromagnetic leakage comprises a first matching step, a second matching step, a transmitting step, a receiving step, and an analysis step.

The first matching step is the process of matching individual antenna modules of the receiving antenna with the wall partitioned areas aimed at measuring electromagnetic wave leakage. For instance, if the individual antenna modules of the receiving antenna are N (=p×q), the wall is divided into N wall partitioned areas, and each module is matched with each area of the wall. It is desirable to have a matching ratio of 1:1 in terms of quantity.

The second matching step is the process of matching individual antenna modules of the receiving antenna with the screen partitioned areas of the signal analyzer's display. It is desirable to match them in a 1:1 ratio in terms of quantity.

The transmitting step is the process of transmitting electromagnetic waves toward the wall using a transmitting antenna from one side of the wall. The electromagnetic waves transmitted towards the wall can be radiated throughout the entire wall or through a specific path.

The receiving step is the process of receiving the electromagnetic waves leaked from the wall partitioned areas by the individual antenna modules assigned to those partitioned areas. Each individual antenna module can be activated simultaneously, in sections, or individually. In other words, it can be scanned simultaneously, in sections, or by individual modules.

The analysis step is the process of analyzing the received electromagnetic waves to identify the location of the leakage and displaying it on the screen. The display shows the wall, and the wall partitioned areas through which the leakage occurs is displayed on the screen partitioned areas, making it conveniently to visually identify the location of the leakage.

The characteristics, structure and effects exemplified in each of the above-mentioned embodiments may be implemented in a different combination or form by one with ordinary knowledge in the field where the embodiments pertain to. Therefore, the contents relevant to such combination and form should be construed to be comprised in the scope of the present disclosure.

The labels depicted in FIGS. 1 and 2 include: 10 transmitting antenna; 20 receiving antenna; 30 signal analyzer; D display partition areas; E individual antenna modules; M wall partition areas; p rows; and q columns.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the scope of the present disclosure, and that they may make various changes, substitutions and alterations herein without departing from the scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

What is claimed is:

1. A system for measuring electromagnetic wave leakage from an electromagnetic wave shielding structure, the electromagnetic wave leakage measurement system comprising:
    a signal generator for generating electromagnetic wave signals;
    a transmitting antenna that receives signals from the signal generator and transmits electromagnetic waves towards one side of the wall of the electromagnetic shielding structure;
    a receiving antenna capable of beam steering, comprising N individual antenna modules, which receives electromagnetic waves that have passed through the wall of the electromagnetic wave shielding structure; and
    a signal analyzer that analyzes and displays the electromagnetic waves received from the receiving antenna.

2. The electromagnetic wave leakage measurement system of claim 1, wherein the receiving antenna is a phased array antenna with N individual antenna modules (E1, E2, . . . , En) arranged in phase.

3. The electromagnetic wave leakage measurement system of claim 2, wherein each of the N individual antenna modules adjusts the direction of the electromagnetic waves by giving different phases to each individual antenna module.

4. The electromagnetic wave leakage measurement system of claim 3, wherein each of the N individual antenna modules receives electromagnetic waves leaking from the wall through the wall partitioned areas (M1, M2, . . . , Mn) assigned to the wall.

5. The electromagnetic wave leakage measurement system of claim 3, wherein each individual antenna module comprises a phase shifter that gives a different phase to adjust the direction of the electromagnetic waves.

6. The electromagnetic wave leakage measurement system of claim 3, wherein each individual antenna module comprises an up-converter that uses binary switches to give different phases to the electromagnetic waves.

7. The electromagnetic wave leakage measurement system of claim 3, wherein the signal analyzer:
    measures the electromagnetic waves received from the individual antenna modules;
    analyzes whether there is any leakage of electromagnetic waves in the wall partitioned areas; and
    displays the results on the display screen's corresponding partitioned areas.

8. The electromagnetic wave leakage measurement system of claim 7, wherein each of the wall partitioned areas (M1, M2, . . . , Mn), individual antenna modules (E1, E2, . . . , En), and screen partitioned areas (D1, D2, . . . , Dn) are mapped in a 1:1:1 ratio.

9. A method for measuring electromagnetic wave leakage from an electromagnetic wave shielding structure, the method of electromagnetic wave leakage measurement comprising:
    the first matching step of matching the wall partitioned areas where the electromagnetic wave leakage is to be measured and the individual antenna modules of the receiving antenna;
    a transmitting step of transmitting an electromagnetic wave towards the wall using a transmitting antenna on one side of the wall;

receiving step of the individual antenna modules assigned to the wall partitioned area, which receives the electromagnetic waves leaked from the wall partitioned area; and an analysis step for analyzing the received electromagnetic waves in the receiving step to determine the location of the electromagnetic wave leakage and displaying the leakage location on a display.

10. A method for measuring electromagnetic wave leakage of an electromagnetic wave shielding structure, comprising:

a first matching step for matching wall partition areas of the wall surface of the structure to be measured for electromagnetic wave leakage with individual antenna modules of a receiving antenna;

a transmission step for transmitting electromagnetic waves towards the wall surface from the one side of the wall using a transmitting antenna;

a receiving step for receiving leaked electromagnetic waves from the wall partition areas by the individual antenna modules assigned to the wall partition areas;

an analysis step for analyzing the received electromagnetic waves to identify the location of the electromagnetic wave leakage; and displaying the leakage location on a display.

* * * * *